United States Patent
Kroneder

(10) Patent No.: US 8,928,135 B2
(45) Date of Patent: Jan. 6, 2015

(54) POWER SEMICONDUCTOR MODULE WITH CONNECTING DEVICES

(75) Inventor: Christian Kroneder, Schwanstetten (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 1073 days.

(21) Appl. No.: 12/220,549

(22) Filed: Jul. 25, 2008

(65) Prior Publication Data
US 2009/0032931 A1  Feb. 5, 2009

(30) Foreign Application Priority Data
Jul. 26, 2007 (DE) .......................... 10 2007 034 847

(51) Int. Cl.
H01L 23/02  (2006.01)
H01L 25/07  (2006.01)
H01L 23/40  (2006.01)

(52) U.S. Cl.
CPC ..... *H01L 25/072* (2013.01); *H01L 2224/32225* (2013.01); *H01L 23/4006* (2013.01); *H01L 2224/291* (2013.01); *H01L 2224/8384* (2013.01)

USPC ............................................. 257/690
(58) Field of Classification Search
USPC .............................. 257/703, E23.18
See application file for complete search history.

(56) References Cited

U.S. PATENT DOCUMENTS 7,006,356 B2 * 2/2006 Bergmann et al. ............ 361/736

FOREIGN PATENT DOCUMENTS

DE          101 00 460        7/2007

* cited by examiner

*Primary Examiner* — Shaun Campbell
*Assistant Examiner* — Raj R Gupta
(74) *Attorney, Agent, or Firm* — The Law Offices of Roger S. Thompson

(57) ABSTRACT

A power semiconductor module having a housing with first connecting devices for arrangement on an external cooling component, at least one substrate carrier with power-electronics circuit arrangements constructed thereon and electrical terminal elements extending therefrom to second connecting devices for connection to external power lines, wherein the first and/or the second connecting devices are constructed as essentially hollow cylindrical metallic molded die-cast parts which are connected to the housing by injection molding.

10 Claims, 2 Drawing Sheets

POWER SEMICONDUCTOR MODULE WITH CONNECTING DEVICES

BACKGROUND OF THE INVENTION

1. Field of the Invention

The invention is directed to a power semiconductor module and, more particularly, to such a module having a housing, at least one substrate carrier, preferably arranged in a recess of the housing and laterally enclosed by the housing, with a power-electronics circuit arrangement constructed thereon and electrical terminal elements extending therefrom.

2. Description of the Related Art

By way of example, a power semiconductor module generally of the inventive type is disclosed in German Patent No. DE 101 00 460 A1 has long been known in its basic form. Such known power semiconductor modules have a substrate carrier which forms the lower termination of the power semiconductor module. The module includes a housing formed of insulating material and protrudes slightly above the substrate carrier on its longitudinal sides, thereby enclosing it. Such substrate carriers are frequently formed as a flat molded metal body, preferably of copper. This results in low thermal resistance with effective spreading of the heat for dissipating heat from the power-electronics circuit arrangement to a cooling component.

According to the prior art, it is also known that the substrate carrier is bonded to the housing in order to prevent the outflow of a liquid insulating material from the housing, when the housing is filled with such a liquid insulating material, for example a silicone rubber. Furthermore, the housing is connected to the substrate carrier by means of metallic rivet connections. These rivet connections are constructed as hollow bodies with a continuous recess in order to also enable the power semiconductor module to be attached to a cooling component by means of a screw connection. According to the prior art, these rivet connections are preferably made of brass since the lead component of the brass allows for a certain deformation.

On the substrate carrier itself, the circuit arrangement of the power semiconductor module is insulated from the carrier. In this context, various circuit arrangements with power transistors, power diodes and/or power thyristors are known. The circuit arrangement is insulated from the substrate carrier by insulating substrates, for example DCB (direct copper bonding) substrates.

Variously designed terminal elements for load and auxiliary terminals are also shown in the prior art. In this context, various technologies for connecting these terminal elements to the substrate or the power semiconductor components of the circuit arrangement are known. Solder connections, pressure contact connections and/or sintered pressure connections are particularly preferred. For the external connections, the load terminal elements preferably have a connecting device for a screw connection. These are frequently constructed as screw nuts loosely embedded in the housing with internal threads and sections of the terminal elements arranged thereover with a continuous recess positioned flush with the internal thread.

SUMMARY OF THE INVENTION

It is therefore an object of the invention to provide a power semiconductor module with devices for connecting to a cooling component and/or external power lines, which are lead-free and simple and cost-effective to manufacture.

The invention includes a power semiconductor module comprising a housing having a recess. At least one substrate carrier is disposed in the recess and enclosed laterally thereby, preferably on all sides. On this substrate carrier, a power-electronics circuit arrangement is constructed from which electrical terminal elements for load and auxiliary terminals extend. The substrate carrier thus forms an outside surface facing the cooling component or part of an outside surface of the power semiconductor module.

In accordance with the invention, the housing has first and/or second connecting devices. These connecting devices are formed as essentially hollow cylindrical molded metallic die-cast parts, preferably of aluminium or zinc.

The first connecting devices are used for arranging the power semiconductor module on, and connecting it to, an external cooling component. For this purpose, the housing of the power semiconductor module has recesses in which a screw for connection to the cooling component may be disposed. This represents a mechanical connection. Since known housings are often made of a plastic, it is advantageous to reinforce this recess by means of a molded metal body. The first connecting devices form this reinforcing molded metal body. In this context, it is preferred if the molded die-cast part of the first connecting device has a smooth inner surface for allowing a screw to pass therethrough. The molded die-cast part is here arranged in the housing in such a manner that the screw rests on a first plane surface of the first molded die-cast part and the opposite surface thereof rests on, or slightly spaced from, the cooling component.

The second connecting devices are used for electrical connection of the module-internal terminal elements to external power lines. From the circuit arrangement on the substrate carrier, the electrical terminal elements, which are preferably constructed as flat, tape-like molded metal bodies produced via punched bending technology, extend to the second connecting devices.

The molded die-cast part of the second connecting device is preferably arranged in the lid of the power semiconductor module and has an internal thread. In this way, it is possible to replace screw nuts arranged in recesses of the housing, previously provided for this purpose in prior art power semiconductor modules. The load terminal element allocated to a second connecting device is arranged in the power semiconductor module so that a section thereof, which has a continuous, preferably elongated, hole-like recess, is flush with the internal thread of the molded die-cast part of the second connecting device. It is thus possible to simply establish the screw connection from the load terminal element to an external power line when using the inventive power semiconductor module.

The first and/or second molded die-cast parts according to the invention are connected to the housing by injection technology. For this purpose, it is advantageous if the respective molded die-cast part has projections at its outer cylinder. This structure improves the connection with the plastic of the housing. For the first molded die-cast part, it is also preferred if these projections are constructed rotationally symmetrically around the vertical axis of the molded die-cast part. For the second molded die-cast part, it is advantageous if these projections are constructed to be nose-like in order to prevent twisting in the housing.

It can also be particularly preferred if the substrate carrier is replaced by the substrate itself in its functionality. In this context, the substrate forms the boundary to the power semiconductor module and, in turn, includes the necessary recesses for the rivet connection.

Particularly preferred developments of this semiconductor component are mentioned in the respective description of the illustrative embodiment. The inventive solution is also explained further by means of the illustrative preferred embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
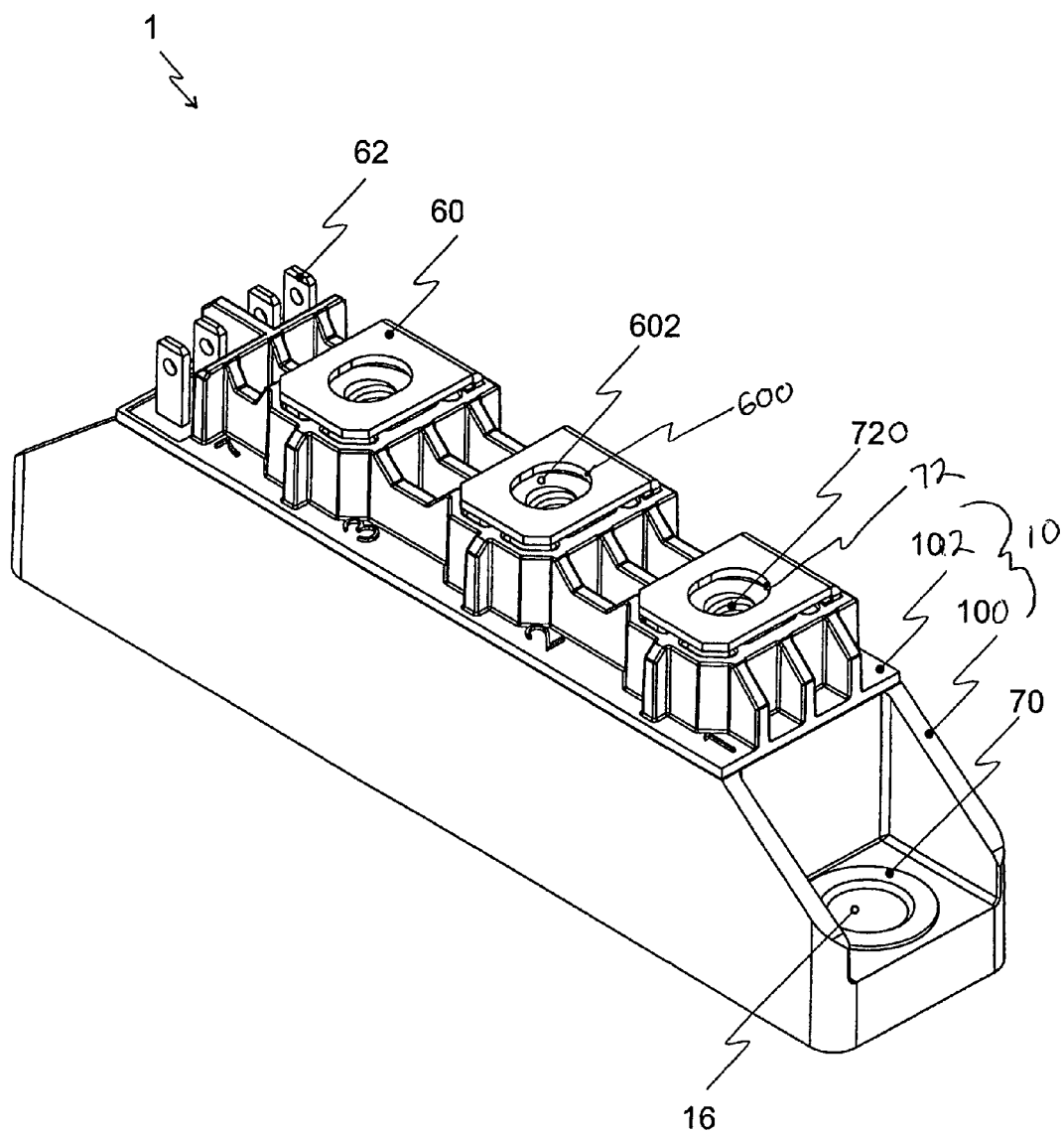
FIG. 1 is a perspective of a power semiconductor module according to the invention.

FIG. 1 shows, generally at 1 a power semiconductor module according to the invention in a perspective view. In this arrangement, power semiconductor module 1 consists of a two-part plastic housing 10, of a plastic which is temperature-stable up to about 150° C., with a basic body 100 and a lid 102, wherein these are advantageously arranged and connected to one another by means of a snap/lock connection (not shown). Basic body 10 has two recesses 16 (only one of which is shown) for the screw connection of module 1 with a cooling component, (also not shown). Recesses 16 have first connecting devices constructed as molded die-cast parts 70 which are connected to basic body 100 of the housing 10 by injection. Molded die-cast parts 70 preferably consist of die-cast aluminium or zinc and have no lead component in the metal used therefor.

Also shown are load 60 and auxiliary terminal elements 62 of power semiconductor module 1. In this context, auxiliary terminal elements 62 are formed with plug-in connections while load terminal elements 60 are constructed with screw connections. Load terminal elements 60 connect the power-electronics circuit arrangement in the interior of the power semiconductor module 1 to second connecting devices 72. Load terminal element 60 has a flat molded metal body with an elongated-hole-like continuous recess 602 formed in a section 600 thereof at an associated connecting device 72. Recess 602 is sized to permit passage therethrough of a screw, and thereby enable the screw connection of an external power line to load terminal element 60 by means of second connecting device 72. In this arrangement, the latter is constructed as a molded die-cast part with an internal thread on its inner cylinder 720 and is connected to lid 102 of housing 10 of the power semiconductor module 1 by injection technology.

Figure 2:
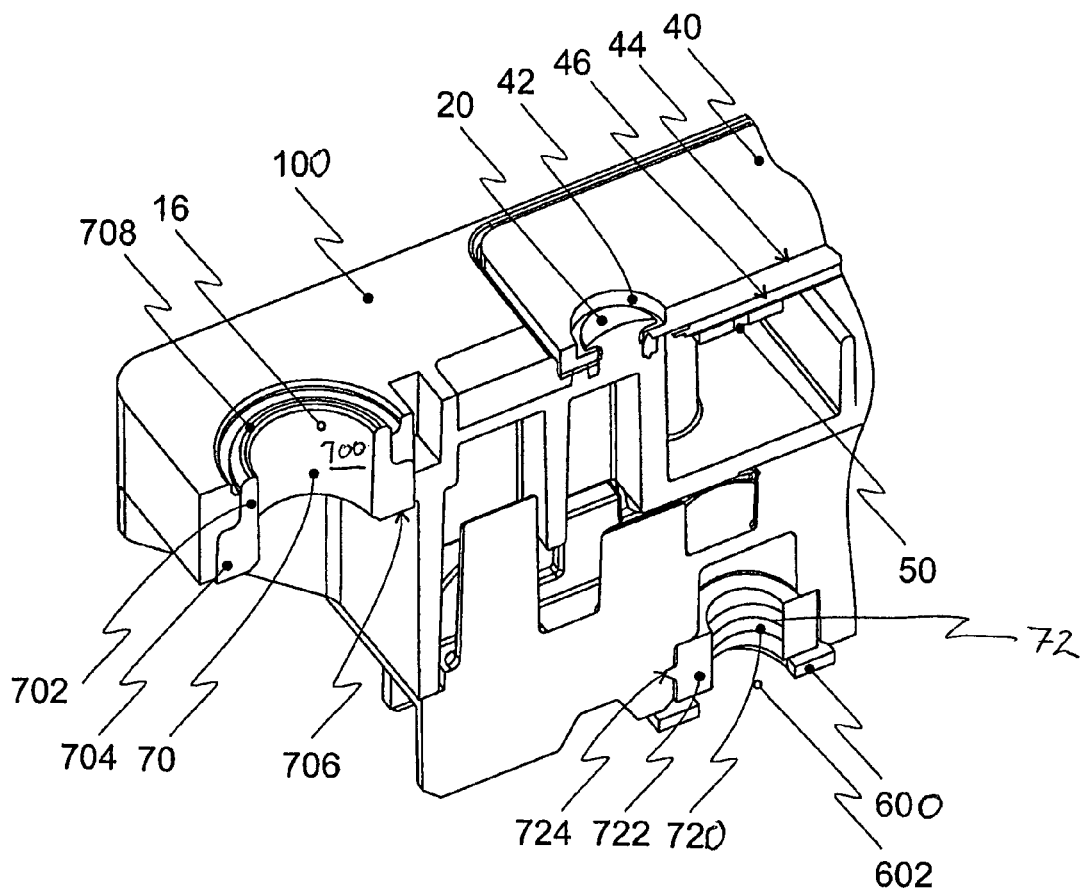
FIG. 2 is a longitudinal section of the underside of the power semiconductor module of FIG. 1.

FIG. 2 shows a longitudinal section of the underside of power semiconductor module 1. It shows housing 10 of power semiconductor module 1 and a substrate carrier 40 enclosed by the former and connected by means of rivet connections 20, 42. Substrate carrier 40 has on a first inner main surface 44, and arranged in an electrically insulated manner, a power-electronics circuit arrangement 50. From the latter, auxiliary and load terminal elements 60 extend (in a manner not shown) to the parallel surface of power semiconductor module 1. An outer main surface 46 of substrate carrier 40 forms a contact surface with a cooling component (also not shown).

First connecting device 70, essentially formed as a hollow cylinder, is injection-molded into basic body 100 of housing 10. For a durable connection with basic body 100, molded die-cast part 70 has on its outer cylinder 702 projections 704 which are preferably constructed rotationally symmetrically around the vertical axis thereof. Its inner cylinder 700 is smooth.

Second connecting device 72, also essentially constructed to be a hollow cylinder, is injection molded into lid 100 of housing 10. For a durable connection with lid 102, molded die-cast part 72 has on its outer cylinder 722 projections 724 which are preferably constructed as noses, preferably arranged around the vertical axis of molded die-cast part 70. On its inner cylinder 720, molded die-cast part 72 has an internal thread.

Load terminal element 60 has in section 600 adjacent to second connecting device 72, a continuous, preferably elongated, hole-like recess 602 which is arranged flush with inner cylinder 720 of the associated molded die-cast part 72 of second connecting device in such a manner that a screw connection of an external power line to the connecting device and the intermediately arranged contact element of the power line is achieved.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
    a housing with first connecting devices for connection to an external cooling component;
    at least one substrate carrier with power-electronics circuit arrangements constructed thereon; and
    electrical terminal elements coupled to second connecting devices for connection to external power lines,
    wherein at least one of said first and said second connecting devices is an essentially hollow metallic cylinder connected to said housing.

2. The power semiconductor module of claim 1,
    wherein said housing includes a recess therein; and
    wherein said substrate carrier is positioned in said recess and is laterally enclosed by said housing.

3. The power semiconductor module of claim 1,
    wherein at least one terminal element is a molded metal body.

4. The power semiconductor module of claim 1,
    wherein said at least one metallic cylinder is formed of at least one of aluminum and zinc.

5. The power semiconductor module of claim 1,
wherein said metallic cylinder of said second connecting device has an inner surface with an internal thread.

6. The power semiconductor module of claim 1,
wherein said at least one metallic cylinder includes an outer surface having projections thereon which are adapted to connect with said housing.

7. The power semiconductor module of claim 6,
wherein said projections are constructed rotationally symmetrically around a vertical axis of said outer surface of said metallic cylinder.

8. The power semiconductor module of claim 6,
wherein said projections are constructed as individual noses around a vertical axis of said outer surface of said metallic cylinder.

9. The power semiconductor module of claim 1,
wherein said metallic cylinder of said first connecting device includes an inner smooth surface.

10. The power semiconductor module of claim 9,
wherein at least one of said electrical terminal elements has a section with a continuous recess that is arranged flush with said inner surface of an associated metallic cylinder of said second connecting device.

\* \* \* \* \*